United States Patent
Liao

(10) Patent No.: US 9,245,977 B2
(45) Date of Patent: Jan. 26, 2016

(54) VERTICAL DOUBLE-DIFFUSION MOS AND MANUFACTURING TECHNIQUE FOR THE SAME

(71) Applicant: Silergy Semiconductor Technology (Hangzhou) LTD, Hangzhou, ZheJiang Province (CN)

(72) Inventor: Zhongping Liao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 14/184,277

(22) Filed: Feb. 19, 2014

(65) Prior Publication Data

US 2014/0284703 A1    Sep. 25, 2014

(30) Foreign Application Priority Data

Mar. 21, 2013  (CN) .......................... 2013 1 0092218

(51) Int. Cl.
H01L 29/66    (2006.01)
H01L 29/78    (2006.01)
H01L 29/08    (2006.01)

(52) U.S. Cl.
CPC ...... *H01L 29/66712* (2013.01); *H01L 29/0878* (2013.01); *H01L 29/7802* (2013.01)

(58) Field of Classification Search
USPC .......................................... 257/329; 438/268
See application file for complete search history.

(56) References Cited

U.S. PATENT DOCUMENTS

| | | | |
|---|---|---|---|
| 5,248,627 A * | 9/1993 | Williams | 438/268 |
| 5,729,037 A * | 3/1998 | Hshieh et al. | 257/329 |
| 5,960,275 A * | 9/1999 | So et al. | 438/211 |
| 8,268,688 B2 | 9/2012 | Doehnel et al. | |
| 8,354,698 B2 | 1/2013 | Chiang et al. | |
| 8,829,641 B2 * | 9/2014 | Marchant | 257/500 |
| 2010/0025776 A1 * | 2/2010 | Horstmann et al. | 257/392 |
| 2013/0037878 A1 | 2/2013 | Wang | |
| 2013/0082321 A1 * | 4/2013 | Sobti et al. | 257/329 |
| 2014/0070312 A1 * | 3/2014 | Yang | H01L 29/66681 257/337 |

FOREIGN PATENT DOCUMENTS

CN          101017850 A       8/2007

* cited by examiner

*Primary Examiner* — Zandra Smith
*Assistant Examiner* — Lawrence Tynes, Jr.
(74) *Attorney, Agent, or Firm* — Michael C. Stephens, Jr.

(57) ABSTRACT

In one embodiment, a method of making a VDMOS transistor can include: (i) etching an oxide layer formed on a surface of an epitaxial structure to define an active region of the VDMOS; (ii) injecting and diffusing a first dopant into the active region to form a doping region; (iii) forming a gate oxide layer on the active region; (iv) depositing polysilicon on the gate oxide layer, and etching the polysilicon to form a gate; (v) injecting a second dopant at an end of the gate to form a source, where the first and second dopants have opposite types; (vi) forming a contact hole adjacent to the gate, and injecting a third dopant into the contact hole, where the first and third dopants have a same type; (vii) depositing and etching aluminum on a chip surface; and (viii) coating the aluminum and chip surface with a passivation layer.

17 Claims, 11 Drawing Sheets

VERTICAL DOUBLE-DIFFUSION MOS AND MANUFACTURING TECHNIQUE FOR THE SAME

RELATED APPLICATIONS

This application claims the benefit of Chinese Patent Application No. 201310092218.X, filed on Mar. 21, 2013, which is incorporated herein by reference in its entirety.

FIELD OF THE INVENTION

The present invention relates to the field of semiconductor devices, and more particularly to a vertical double-diffusion MOS, as well as a method of making such a device.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. In this way, the output voltage and/or the output current of the switching power supply can be maintained as substantially constant. Therefore, the selection and design of the particular control circuitry and approach is very important to the overall performance of the switching power supply. Thus, using different detection signals and/or control circuits can result in different control effects on power supply performance.

SUMMARY

In one embodiment, a method of making a VDMOS transistor can include: (i) etching an isolated oxide layer formed on a surface of an epitaxial structure to define an active region of the VDMOS; (ii) injecting a first dopant into the active region, and diffusing the first dopant to form a doping region; (iii) forming a gate oxide layer on a surface of the active region; (iv) depositing polysilicon on the gate oxide layer, and etching the polysilicon to form a gate; (v) injecting a second dopant at an end of the gate to form a source, where the first and second dopants have opposite types; (vi) forming a contact hole adjacent to the gate, and injecting a third dopant into the contact hole, where the first and third dopants have a same type; (vii) depositing and etching aluminum on a chip surface; and (viii) coating the aluminum and the chip surface with a passivation layer.

In one embodiment, a VDMOS transistor can include: (i) an isolated field oxide layer on an epitaxial structure, where the isolated field oxide layer covers surface areas outside of an active region of the VDMOS; (ii) doping regions in the epitaxial structure, where the doping regions comprises a first dopant; (iii) a gate oxide layer on the doping region; (iv) a gate on the gate oxide region, where the gate extends to adjacent of the doping regions; (v) a dielectric layer on surfaces of the gate; (vi) source regions at either side of the gate in the doping regions, where the source regions comprise a second dopant having a type that is opposite to that of the first dopant; (vii) a contact hole region between the source regions in the doping regions, where the contact hole comprises a third dopant having a same type as the first dopant; and (viii) an aluminum metal layer and a passivation layer on a chip surface.

Embodiments of the present invention can provide several advantages over conventional approaches, as may become readily apparent from the detailed description of preferred embodiments below.

DETAILED DESCRIPTION

Figure 1:
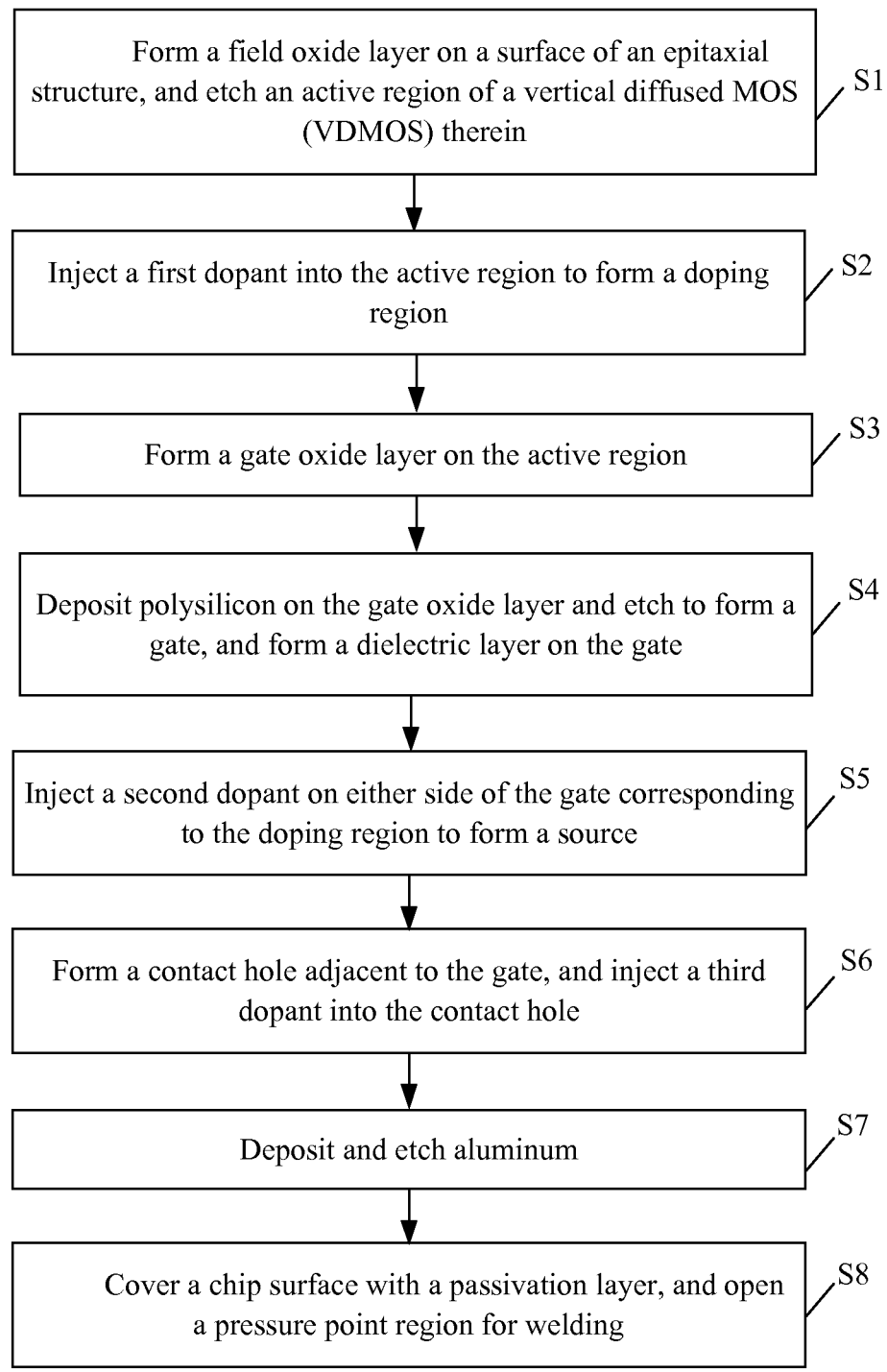
FIG. 1 is a flow diagram of an example method of making a vertical double-diffusion MOS (VDMOS), in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A power device (e.g., a metal oxide semiconductor field-effect transistor [MOSFET]) can be utilized in a power supply or regulator (e.g., a switching voltage regulator). Power losses through the power device or transistor can be reduced by reducing the conductive resistance of the MOSFET device. One type of transistor that is suitable for power device application is a vertical diffused MOS (VDMOS), which is also sometimes referred to as a double-diffused MOS (DMOS), or a vertical double-diffusion MOS (VDMOS). In a VDMOS, the source electrode is placed over the drain, resulting in a current that is mainly vertical when the transistor is in the on-state.

The "diffusion" in VDMOS refers to the manufacturing process where the P wells can be obtained by a diffusion process (e.g., a double diffusion process to get the P and $N^+$ regions). Power MOSFETs may have a different structure than a lateral MOSFET. As with most power devices, their structure is vertical, as opposed to lateral or planar. In a planar structure, the current and breakdown voltage ratings are both functions of the channel dimensions (e.g., width and length of the channel). However, in a vertical structure, the voltage rating of the transistor may be a function of the doping and thickness of the N-epitaxial layer, while the current rating can be a function of the channel width. This makes it possible for the transistor to sustain both high blocking voltage and high current within a relatively compact piece of silicon.

VDMOS may have advantages found in both bipolar transistors and standard MOS transistors, including favorable static input impedance characteristics and relatively fast switching times. Therefore, VDMOS transistors may be utilized as an ideal power device whether for switched applications (e.g., a switched-mode power supply [SMPS]) or linear applications. Example applications of VDMOS transistors include power supplies or converters, motor speed regulation, power inverters, uninterrupted switches, electrical switches, hi-fi audio circuits, automotive electrical appliances, and electrical ballasts.

However, in existing manufacturing techniques of VDMOS transistors, the step of forming the gate (e.g., including polysilicon deposition) can occur prior to the step of forming the doping region. Though only one pass of photolithographic etching may be required in such an approach, the injection of a depletion layer for a depletion type of VDMOS transistor can include self-aligned injection. As a result, the depletion channel may be relatively thick, which can decrease the breakdown voltage of the transistor, and may cause electrical leakage in some cases.

In one embodiment, a method of making a VDMOS transistor can include: (i) etching an isolated oxide layer formed on a surface of an epitaxial structure to define an active region of the VDMOS; (ii) injecting a first dopant into the active region, and diffusing the first dopant to form a doping region; (iii) forming a gate oxide layer on a surface of the active region; (iv) depositing polysilicon on the gate oxide layer, and etching the polysilicon to form a gate; (v) injecting a second dopant at an end of the gate to form a source, where the first and second dopants have opposite types; (vi) forming a contact hole adjacent to the gate, and injecting a third dopant into the contact hole, where the first and third dopants have a same type; (vii) depositing and etching aluminum on a chip surface; and (viii) coating the aluminum and the chip surface with a passivation layer.

Referring now to FIG. 1, shown is a flow diagram of an example method of making a VDMOS device, in accordance with embodiments of the present invention. At S1, a field oxide (FOX) layer can be formed on a surface of an epitaxial structure, and an active region for the VDMOS can be etched therein. For example, the FOX layer can be grown on the epitaxial structure (e.g., wafer) surface. The etching process can chemically remove layers (e.g., oxide) or portions of layers from the surface of a wafer during manufacturing. For many etch steps, part of the wafer can be protected from the etchant by a "masking" material (e.g., patterned photoresist, silicon nitride, etc.) that resists etching. Any suitable type of etching (e.g., wet etching, dry etching, plasma etching, etc.) can be employed to form the trenches in particular embodiments.

At S2, a first dopant can be injected (e.g., via ion implantation) into the active region, and diffused to form a doping region. A dopant or doping agent can include a trace impurity element inserted into the active region in order to alter electrical properties thereof. Examples of dopants can include boron, arsenic, phosphorus, antimony, as well as other substances, depending on the dopant type, application, and/or semiconductor substrate. For example, the diffusion can include a heating or annealing process in order to activate the implanted dopants. At S3, a gate oxide layer can be formed (e.g., grown) on the surface of the active region. The gate oxide layer can be a relatively thin layer of oxide. At S4, polysilicon can be deposited on the surface of the gate oxide layer, and then etched to form a gate structure. Also, a dielectric layer (e.g., oxide) may be formed on the gate. For example, the dielectric layer can coat exposed surfaces of the gate.

At S5, a second dopant can be injected (e.g., via ion implantation) on either side of the gate corresponding to the doping region to form a source. At S6, a contact hole can be formed adjacent to the gate, and a third dopant can be injected into the contact hole. The contact hole can be formed by etching a portion of the oxide layer at a desired location, such as defined by a mask. For example, the type of the third dopant can be the same as that of the first dopant. At S7, an aluminum metal layer can be deposited, and then etched to form desired metal patterns (e.g., for connections between devices). At S8, a passivation layer can be applied to cover a chip surface or exposed surfaces, and pressure point area (e.g., a contact hole or via) for welding (e.g., connecting to a metal layer, chip surface, and/or chip substrate) can be opened in the passivation layer.

In one particular example, in order to reduce or otherwise regulate the JFET conduction resistance of the VDMOS transistor, a separate injection (e.g., a JFET injection) and diffusion at the active region can also be included. In some applications, the entire chip surface can be injected or ion implanted in this fashion. However, due to the isolated field oxide layer, self-aligned injection can result because the field oxide may block such ion implantation. Therefore, the JFET injection may only effectively occur at active region positions on the wafer. Also, any suitable impurities (e.g., phosphorus) can be employed for the JFET impurity. For example, the diffused impurities of the JFET injection can act to effectively lower a threshold voltage of the VDMOS in order to decrease the conduction resistance of the VDMOS transistor.

Figure 2A:
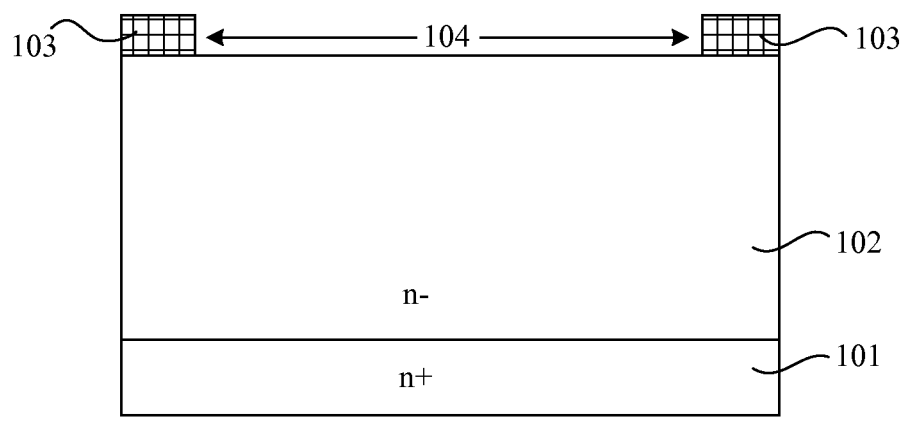
FIGS. 2A-2I are cross-sectional diagrams showing example process step progressions for making a VDMOS, in accordance with embodiments of the present invention.

Exemplary steps of an example manufacturing process for making a VDMOS transistor in particular embodiments will now be described with reference to FIGS. 2A-2I, for an example N-type VDMOS transistor. As shown in FIG. 2A (e.g., corresponding to S1 of FIG. 1), N-type epitaxial layer 102 can be grown on N-type substrate 101. An isolated field oxide layer 103 (FOX) can be formed on a surface of epitaxial layer 102. Field oxide layer 103 can then be etched to form active region 104 for the VDMOS transistor. Thus, the etching may remove the oxide layer portions of field oxide 103 form the active region.

Figure 2B:
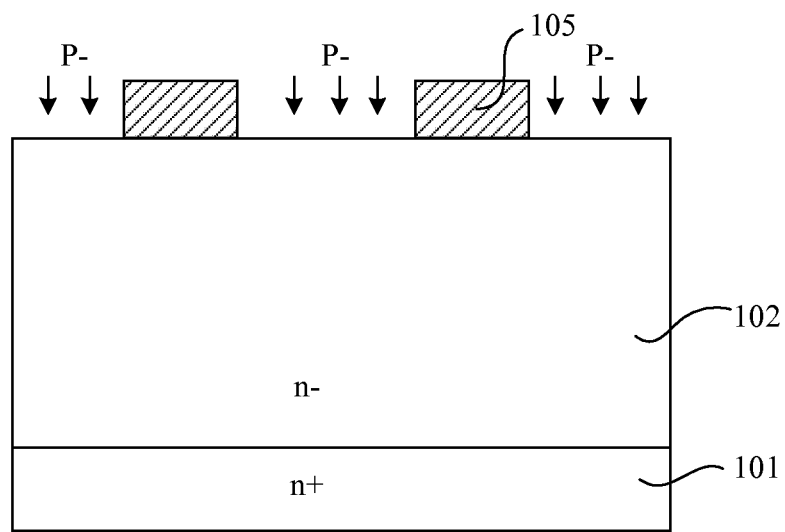
Figure 2C:
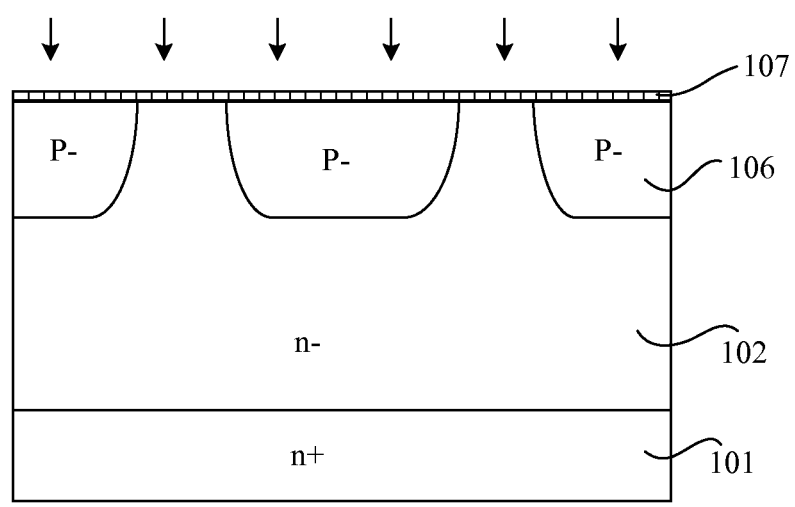

Referring now to FIG. 2B, photoresist 105 may be coated on a surface of the active region, and corresponding positions can be exposed to use the photoresist as a barrier or masking layer. Then, P-dopant can be injected into the ion injection port or ion implantation location. As shown in FIG. 2C (e.g., corresponding to S2 of FIG. 1), this dopant can be diffused to form doping region 106 (e.g., P-body). For example, the P-dopant may be boron, and other regions covered by isolated oxide layer 103 may also be included in the structure. Also as shown in FIG. 2C (e.g., corresponding to S3 of FIG. 1), gate oxide layer 107 can be formed on the surface of chip, including the active region.

Figure 2D:
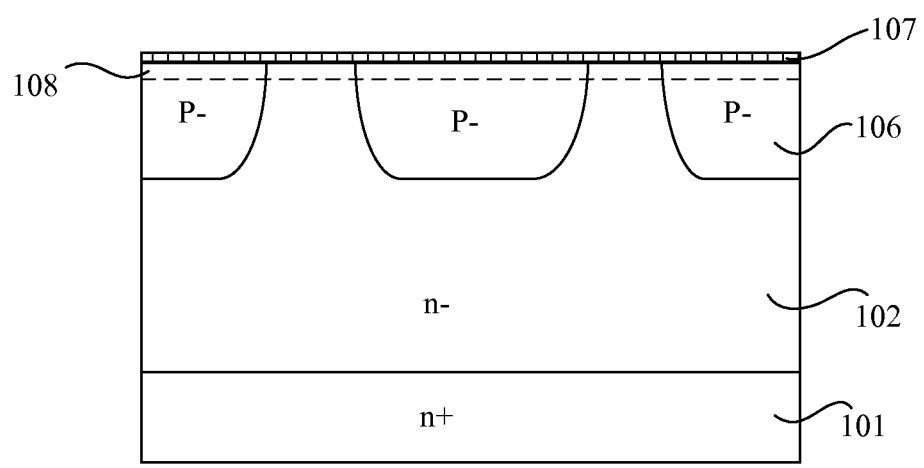

If the N-type VDMOS transistor is a depletion type of transistor, the following can be added after S3 of FIG. 1. As shown in FIG. 2D, gate oxide layer 107 can be utilized as a barrier layer for depletion channel injection into the chip surface (including the active region) to form depletion layer 108. For example, the doping material of the depletion layer can be arsenic. Also, the type of the depletion channel (e.g., N-type) may be opposite to the type of the first dopant (e.g., P-type). In the example of FIG. 2D, the manufactured VDMOS may not have problems of reduced breakdown voltage and possible electrical leakage, as discussed above. When such depletion channel injection is performed, gate oxide layer 107, as a barrier layer, may be destroyed or sacrificed. Thus, a new gate oxide layer can subsequently be formed in this case. Also, for enhancement type VDMOS transistors, this depletion layer formation may not be needed.

Figure 2E:
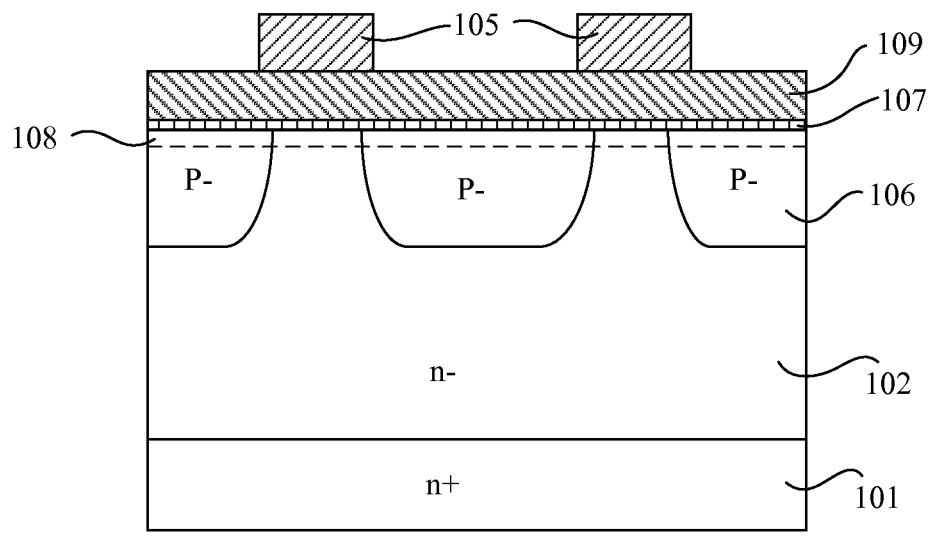
Figure 2F:
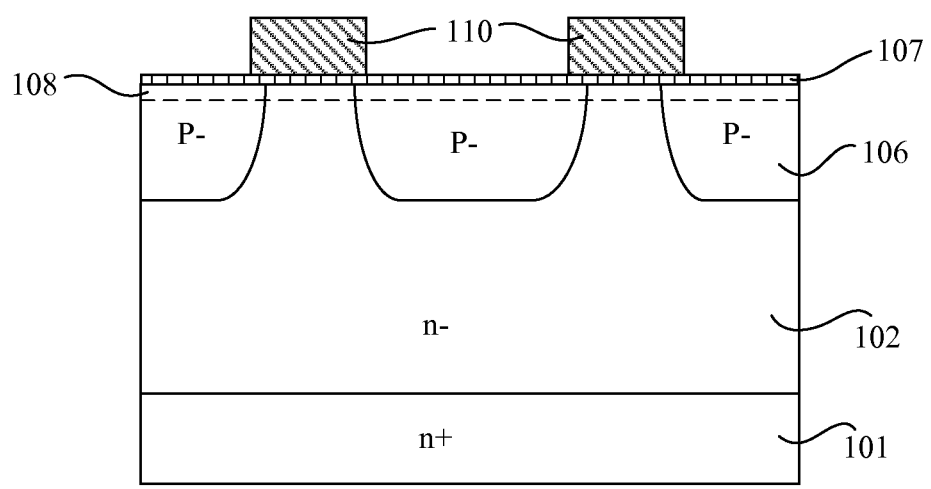

As shown in FIG. 2E, polysilicon 109 can be deposited on the surface of gate oxide layer 107, and photoresist 105 can be coated on the surface of polysilicon 109. Corresponding positions can be exposed and patterned using photolithographic techniques, and exposed photoresist 105 may be used as a barrier or masking layer for polysilicon etching. This process can be used to form gate 110, as shown in FIG. 2F (e.g., corresponding to S4 of FIG. 1). In some cases, in order to avoid surface contamination of gate oxide layer 107, the structure may enter into a furnace tube to perform polysilicon deposition shortly after the gate oxide layer is formed. By comparing the position relationship of gate 110 and doping region 106, it can be seen that the photolithography technique described in S2 and S4 of FIG. 1 may share a same mask or photoetching board, in order to reduce production costs.

Figure 2G:
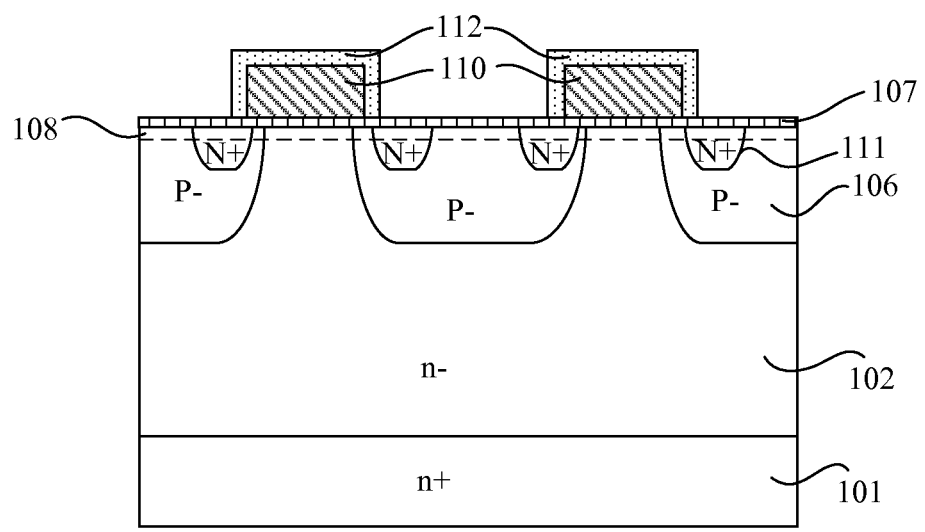

Referring now to FIG. 2G (e.g., corresponding to S5 of FIG. 1), N-type dopant can be injected (e.g., via ion implantation) at one or more positions corresponding to an end (e.g., on either side) of gate 110 in doping region 106, to form source 111 (source N+). For example, the N-type dopant for source 111 formation may be arsenic, phosphorus, or antimony. In addition, dielectric layer (e.g., oxide) 112 may be formed on exposed surfaces of gate 110. In this way, gate 110 can be protected from subsequent processes and/or connectivity levels. Further, contact holes formed in dielectric layer 112 (e.g., outside of the active region) in order to contact with subsequent layers (e.g., a metal layer).

Figure 2H:
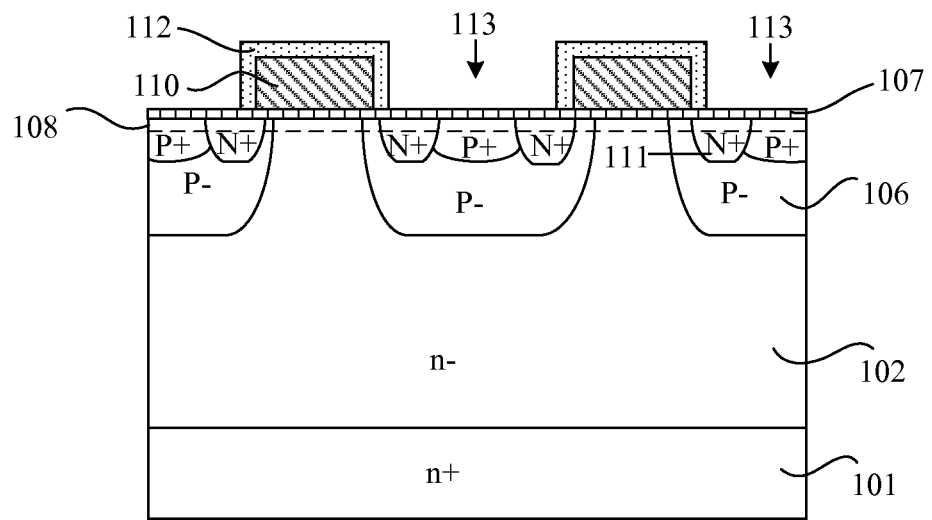

As shown in FIG. 2H (e.g., corresponding to S6 of FIG. 1), contact hole 113 can be formed adjacent to or between gate(s) 110. For example, the contact hole can be an etched hole in gate oxide layer 107 corresponding to positions for subsequent (e.g., metal layer) contacting (e.g., to P-body 106). Also, a P+ injection can be made into contact hole 113. In some cases, the ion implantation or P+ injection can substantially occur through the relatively thin gate oxide layer. In one particular example, the dopant or impurity element injected into contact hole 113 can include boron. Further, contact hole 113 can be etched, and then the oxide layer portion (e.g., oxide sidewalls) may rinsed by a wet process in order to remove unwanted particles therefrom.

Figure 2I:
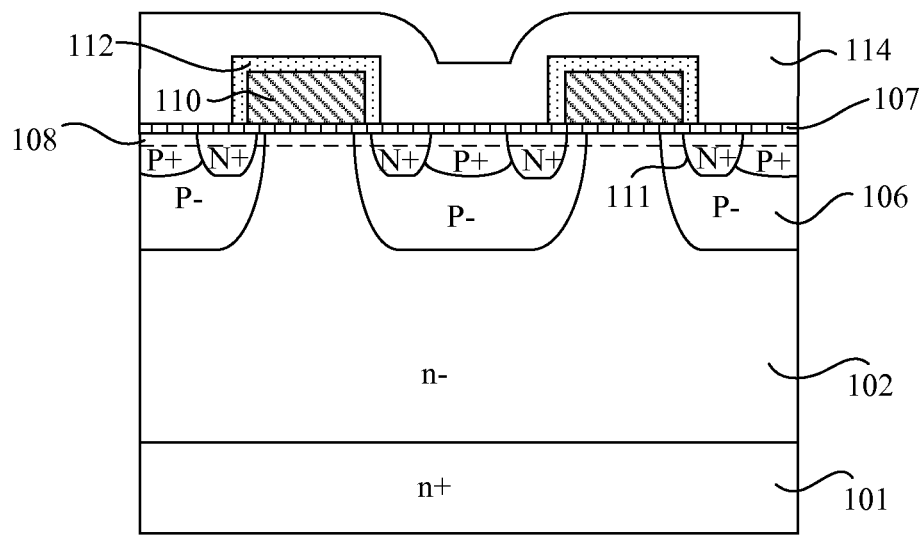

Referring now to FIG. 2I (e.g., corresponding to S6 and S7 of FIG. 1), after contact hole 113 is formed, an aluminum metal layer can be deposited on the surface of the chip. The deposited aluminum can be patterned and etched to form metal layer 114. Also, a passivation layer (not shown) can cover exposed surfaces of the chip, including metal layer 114. Further, a pressure point area (e.g., a contact hole or via) for welding (e.g., connecting to metal layer 114, a chip surface, and/or substrate 101) can be opened in the passivation layer. In some cases, a drain contact can be formed at a bottom of the structure on substrate 101. Also, the deposited aluminum can be relatively thick in order to enhance reliability of the VDMOS transistor.

In particular embodiments, making a VDMOS transistor can include a relatively simplified process, with reduced photoetching time, and different process steps that can share a same mask or photoetching board, in order to reduce production costs, as compared to conventional approaches. In addition, while an example N-type VDMOS transistor has been described in the examples above, those skilled in the art will recognize that other types of transistors (e.g., P-type VDMOS), as well as enhancement or depletion type transistors, can also be employed in particular embodiments.

Particular embodiments can also include a VDMOS transistor structure formed substantially by a process as described herein. In one embodiment, a VDMOS transistor can include: (i) an isolated field oxide layer on an epitaxial structure, where the isolated field oxide layer covers surface areas outside of an active region of the VDMOS; (ii) doping regions in the epitaxial structure, where the doping regions comprises a first dopant; (iii) a gate oxide layer on the doping region; (iv) a gate on the gate oxide region, where the gate extends to adjacent of the doping regions; (v) a dielectric layer on surfaces of the gate; (vi) source regions at either side of the gate in the doping regions, where the source regions comprise a second dopant having a type that is opposite to that of the first dopant; (vii) a contact hole region between the source regions in the doping regions, where the contact hole comprises a third dopant having a same type as the first dopant; and (viii) an aluminum metal layer and a passivation layer on a chip surface.

For example, the VDMOS transistor structure can include doping region 106 (e.g., P-body) formed in epitaxial layer 102 on substrate 101, and having a first dopant (e.g., a P-type impurity). Gate oxide layer 107 can be formed on doping region 106 and the active region of the VDMOS transistor. Gate 110 can be formed on gate oxide region 107, and may extend to adjacent doping regions 106. Source 111 (e.g., N+) can be formed at either side of gate 110 in doping region 106. For example, source 111 may have a second dopant (e.g., an N-type impurity) of which the type is opposite to that of the first dopant.

In addition, field oxide layer 103 can cover regions outside the active region on a surface of epitaxial structure 102. Also, dielectric layer 112 can be formed on surfaces of gate 110. Further, contact hole 113, including a P+ region in P-body 106, can be formed between gates 110. For example, the P+ region for contact hole 113 can be positioned between N+ source regions 111. For example, the contact hole may have third dopant (e.g., a P-type impurity) of which the type is the same as that of the first dopant.

A metal layer (e.g., aluminum) 114 and passivation layer can be formed on surfaces of the chip. Also, a pressure point area (e.g., a contact hole or via) for welding (e.g., connecting to metal layer 114, a chip surface, and/or substrate 101) can be formed in the passivation layer. Further, in order to reduce conduction resistance of the VDMOS transistor, its JFET resistance can be regulated by use of a JFET injection. Thus, particular embodiments can also include a JFET injection layer in some cases. In addition, when the VDMOS transistor is a depletion type of VDMOS, particular embodiments can also include depletion channel layer 108 under gate oxide layer 107, and covering the active region.

Certain embodiments can also provide a power device (e.g., a power transistor) that utilizes a process and/or is fabricated in a wafer structure, as described herein. Any such power device (e.g., a super-junction MOSFET, an insulated gate bipolar transistor [IGBT], a VDMOS transistor, a diode, etc.) can be employed in particular embodiments, and may be included in a switching voltage regulator or SMPS.

Figure 3:
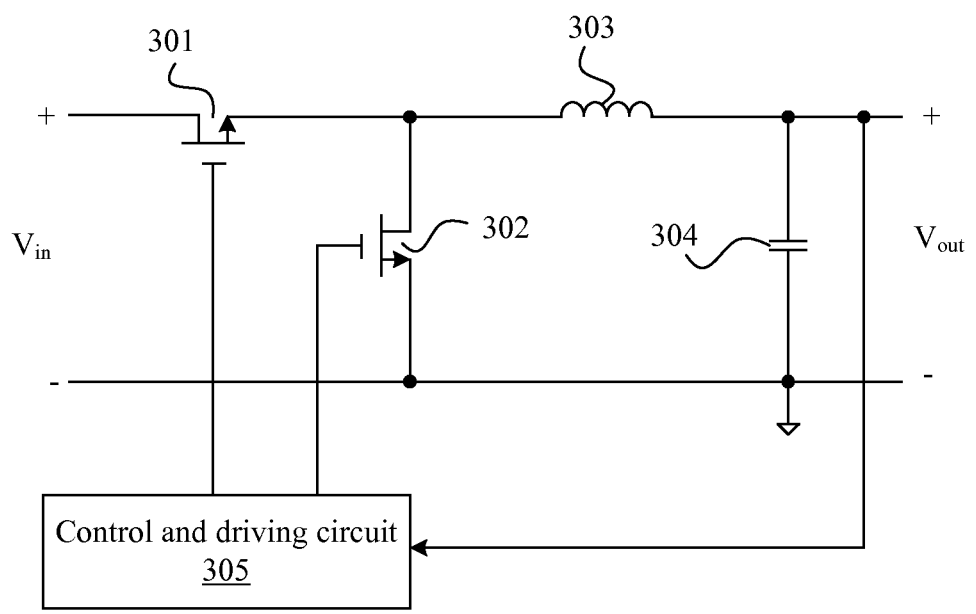
FIG. 3 is a schematic diagram of an example synchronous switching voltage regulator, in accordance with embodiments of the present invention.

Referring now to FIG. 3, shown is a schematic diagram of an example switching voltage regulator that includes power devices as described herein. A switching voltage regulator is just one example of the circuitry that can be wholly or partially fabricated in the wafer structure and/or using processes of particular embodiments. In this example, power transistors 301 and 302, inductor 303, and capacitor 304 can form a synchronous buck power stage circuit. In other cases, other types of power stage or converter circuits (e.g., flyback, SEPIC, boost, buck-boost, etc.) can be formed. Control and driving circuit 305 (e.g., including a pulse-width modulation [PWM] controller) can receive an output signal of the power stage circuit, to form a closed-loop feedback control loop to control the switching state of power transistors 301 and 302. In this way, the output signal of the power stage circuit can be controlled to be substantially constant.

Of course, other integration or grouping of circuitry into different chips, ICs, or wafers can be accommodated in particular embodiments. In one example, a multi-chip packaging structure in particular embodiments can include power transistors 301 and 302 being integrated into a power device chip, and control and driving circuit 305 being integrated into a control chip. Since the power device may process a high voltage and/or a high current, the power device chip with a large area can be able to withstand a relatively high voltage and a relatively high current. Also, the power device may have good thermal characteristics for power supply integration.

For the integrated circuit of the switching voltage regulator shown in FIG. 3, if the carrying capacity of power transistor 302 is greater than that of power transistor 301, power transistor 302 may be much larger than power transistor 301. Thus, power transistor 302 (e.g., the synchronous power device) can be integrated in a single synchronous power device chip, and power transistor 301 (e.g., the main power device) as well as control and driving circuit 305 can be integrated in another single mixed chip. Further, power transistors 301 and/or 302 can be any suitable types of transistors or devices (e.g., super-junction MOS transistors, VDMOS, LDMOS, IGBT, etc.)

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A method of making a vertical double-diffusion MOS (VDMOS) transistor, the method comprising:
   a) etching an isolated oxide layer formed on a surface of an epitaxial structure to define an active region of said VDMOS transistor;
   b) injecting a first dopant into said active region, and diffusing said first dopant to form a doping region, wherein said doping region comprises a body region for said VDMOS transistor;
   c) after said body region is formed, forming a gate oxide layer on a surface of said active region;
   d) depositing polysilicon on said gate oxide layer, and etching said polysilicon to form a gate;
   e) injecting a second dopant at an end of said gate to form a source in said body region, wherein said first and second dopants have opposite types;
   f) forming a contact hole adjacent to said gate, and injecting a third dopant into said contact hole, wherein said first and third dopants have a same type;
   g) depositing and etching aluminum on a chip surface; and
   h) coating said aluminum and said chip surface with a passivation layer.

2. The method of claim 1, wherein said forming said active region and said gate comprise using a same mask.

3. The method of claim 1, further comprising performing JFET injection and diffusion at said active region.

4. The method of claim 1, further comprising performing depleted channel injection to said active region to form a depletion layer, wherein said depletion layer and said first dopant have opposite types.

5. The method of claim 4, further comprising:
   a) etching said gate oxide layer; and
   b) forming a new gate oxide layer at said active region.

6. The method of claim 1, wherein said body region comprises a P-body region.

7. The method of claim 1, wherein said body region comprises an N-body region.

8. The method of claim 1, wherein said epitaxial structure is on a substrate.

9. A vertical double-diffusion MOS (VDMOS) transistor, comprising:
   a) an isolated field oxide layer on an epitaxial structure, wherein said isolated field oxide layer covers surface areas outside of an active region of said VDMOS transistor;
   b) doping regions in said epitaxial structure, wherein each of said doping regions comprises a first dopant, wherein each of said doping regions comprises a body region for said VDMOS transistor;
   c) a gate oxide layer on said doping region, wherein said gate oxide layer is formed after said body regions are formed;
   d) a gate on said gate oxide region, wherein said gate extends to adjacent of said doping regions;
   e) a dielectric layer on surfaces of said gate;
   f) source regions at either side of said gate in said body regions, wherein said source regions comprise a second dopant having a type that is opposite to that of said first dopant;
   g) a contact hole region between said source regions in said body regions, wherein said contact hole comprises a third dopant having a same type as said first dopant; and
   h) an aluminum metal layer and a passivation layer on a chip surface.

10. The VDMOS transistor of claim 9, further comprising a JFET injection layer.

11. The VDMOS transistor of claim 9, further comprising a depletion layer under said gate oxide layer and covering said active region.

12. The VDMOS transistor of claim 9, wherein each of said body regions comprises a P-body region.

13. The VDMOS transistor of claim 9, wherein each of said body regions comprises an N-body region.

14. The VDMOS transistor of claim 9, further comprising a substrate under said epitaxial structure.

15. The VDMOS transistor of claim 14, further comprising a drain contact at a bottom of said substrate.

16. A switching voltage regulator, comprising:
   a) the VDMOS transistor of claim 9; and
   b) an inductor coupled to said VDMOS transistor.

17. The method of claim 8, further comprising forming a drain contact at a bottom of said substrate.

* * * * *